United States Patent
Rodriguez et al.

(10) Patent No.: US 10,768,236 B2
(45) Date of Patent: Sep. 8, 2020

(54) METHOD FOR DETECTING A ROTOR BAR FAULT

(71) Applicant: ABB Schweiz AG, Baden (CH)

(72) Inventors: Pedro Rodriguez, Västerås (SE); Subrat Sahoo, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/496,863

(22) PCT Filed: Mar. 6, 2018

(86) PCT No.: PCT/EP2018/055439
§ 371 (c)(1),
(2) Date: Sep. 23, 2019

(87) PCT Pub. No.: WO2018/177697
PCT Pub. Date: Oct. 4, 2018

(65) Prior Publication Data
US 2020/0110133 A1  Apr. 9, 2020

(30) Foreign Application Priority Data

Mar. 30, 2017 (EP) .................. 17163815

(51) Int. Cl.
*G01R 31/34* (2020.01)
*H02K 11/25* (2016.01)
(Continued)

(52) U.S. Cl.
CPC ............ *G01R 31/343* (2013.01); *H02K 3/20* (2013.01); *H02K 11/25* (2016.01); *H02K 19/14* (2013.01)

(58) Field of Classification Search
CPC .... G01R 31/343; G01R 31/346; H02K 11/25; H02K 3/20; H02K 19/14
See application file for complete search history.

(56) References Cited

U.S. PATENT DOCUMENTS

| 4,761,703 A | 8/1988 | Kliman et al. |
| 4,808,932 A | 2/1989 | Schulz, Jr. et al. |

(Continued)

FOREIGN PATENT DOCUMENTS

| CN | 102279342 A | 12/2011 |
| DE | 102015014689 A1 | 7/2016 |

(Continued)

OTHER PUBLICATIONS

Artioli, M. et al: "A general purpose software for distance monitoring and diagnosis of electrical machines", Diagnostics for Electric Machines, Power Electronics and Drives, 2003. SDEMPED 2003, 4th IEEE International Symposium, Aug. 24-26, 2003, Piscataway, NJ, published Aug. 24, 2003, pp. 272-276. 5 Pages.

(Continued)

*Primary Examiner* — Thang X Le
(74) *Attorney, Agent, or Firm* — Whitmyer IP Group LLC

(57) ABSTRACT

A rotor bar fault in a rotor of an electrical machine having a plurality of rotor bars and an end ring configured to short circuit the rotor bars. The method includes the steps of measuring a first temperature at a first end ring location, and measuring a second temperature at a second end ring location, the second end ring location being different from the first end ring location. As broken rotor bars cause a non-uniform temperature distribution in the end ring, the detection of rotor bar faults can be based on monitored temperatures at different end ring locations.

8 Claims, 1 Drawing Sheet

(51) Int. Cl.
*H02K 3/20* (2006.01)
*H02K 19/14* (2006.01)

(56) References Cited

U.S. PATENT DOCUMENTS

| | | | |
|---|---|---|---|
| 5,680,025 A | 10/1997 | Bowers, III et al. | |
| 6,529,135 B1* | 3/2003 | Bowers | H02P 29/024 |
| | | | 340/648 |
| 8,791,716 B2* | 7/2014 | Tanimoto | B60L 3/0061 |
| | | | 324/765.01 |
| 10,353,004 B2* | 7/2019 | Mulay | G01R 33/04 |
| 2001/0008352 A1 | 7/2001 | Nondahl et al. | |
| 2008/0055799 A1* | 3/2008 | Serizawa | H02H 5/044 |
| | | | 361/24 |
| 2008/0067963 A1* | 3/2008 | Pronovost | G01K 7/42 |
| | | | 318/473 |
| 2013/0181568 A1 | 7/2013 | Bangura | |
| 2016/0274192 A1* | 9/2016 | Zettner | G01K 13/08 |
| 2017/0138559 A1* | 5/2017 | Hartisch | B60Q 11/005 |

FOREIGN PATENT DOCUMENTS

| | | |
|---|---|---|
| JP | H06245449 A | 9/1994 |
| JP | H0888959 A | 4/1996 |
| KR | 101432786 B1 | 9/2014 |

OTHER PUBLICATIONS

Berry, P. et al:"An Investigation into Damper Winding Failure in a Large Synchronous Motor", published 2015. 4 Pages.

International Search Report & Written Opinion of the International Searching Authority Application No. PCT/EP2018/055439 Completed: Jun. 1, 2018; dated Jun. 14, 2018 11 Pages.

Antonio-Daviu, J. et al: "Reporting false indications of startup analysis when diagnosing damper damages in synchronous motors", published 2016, pp. 434-438 5 Pages.

Toliyat et al: "Transient Analysis of Cage Induction Machines Under Stator, Rotor Bar and End Ring Faults", IEEE Transactions of Energy Conversion, vol. 10, No. 2, published Jun. 1995, pp. 241-247. 7 Pages.

Antonio-Daviu, J. et al: "Transient-based analysis for the detection of broken damper bars in synchronous motors", published 2012, Valencia, Spain, pp. 367-377. 11 Pages.

International Preliminary Report on Patentability Application No. PCT/EP2018/055439 Completed: Oct. 1, 2019 8 Pages.

Korean Office Action and Translation Application No. 10-2019-7027014 Completed: Jan. 7, 2020 9 pages.

* cited by examiner

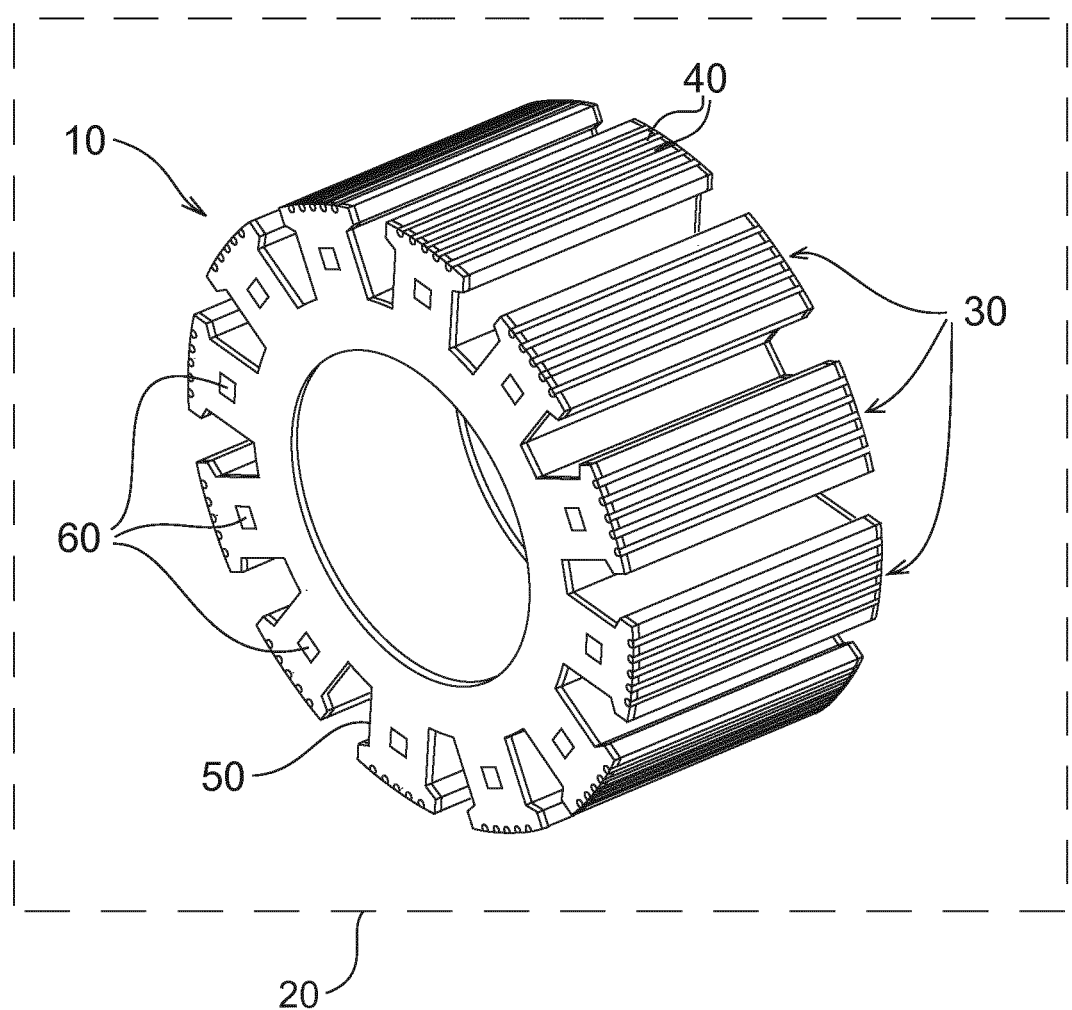

METHOD FOR DETECTING A ROTOR BAR FAULT

TECHNICAL FIELD

The present invention relates to electrical machines, and particularly to a method for detecting a rotor bar fault in a rotor of an electrical machine.

BACKGROUND

It is conventionally known to detect different fault conditions in electrical machines on the basis of measurements on different machine parameters. For example, according to U.S. Pat. No. 5,680,025A faults like broken rotor bars, eccentricity, imbalance between phases and stator electrical faults can be detected on the basis of temperature, magnetic flux, and shaft current measurements. According to U.S. Pat. No. 5,680,025A the detection of broken rotor bars is based on magnetic flux measurements.

There remains a desire to provide alternative ways of detecting a rotor bar fault.

SUMMARY

One object of the invention is to provide an improved method for detecting a rotor bar fault in a rotor of an electrical machine, the method being simpler and based on alternative measurements in comparison with the prior art solutions. A further object of the invention is to provide an improved rotor and thereby an improved electrical machine.

These objects are achieved by the method and the device according to the invention.

The invention is based on the realization that a broken rotor bar causes a non-uniform temperature distribution in an end ring of a rotor.

According to a first aspect of the invention, there is provided a method for detecting a rotor bar fault in a rotor of an electrical machine comprising a plurality of rotor bars and an end ring configured to short circuit the rotor bars. The method comprises the steps of measuring a first temperature at a first end ring location, and measuring a second temperature at a second end ring location, the second end ring location being different from the first end ring location.

According to one embodiment of the invention, the method further comprises the step of comparing the first temperature with the second temperature.

According to one embodiment of the invention, the method further comprises the step of calculating a temperature difference between the first temperature and the second temperature.

According to one embodiment of the invention, the method further comprises the step of comparing the temperature difference with a predetermined first threshold value.

According to one embodiment of the invention, the method further comprises at least one of the steps of determining, on the basis that the temperature difference is equal to or higher than the predetermined first threshold value, that a rotor bar fault is present, and determining, on the basis that the temperature difference is lower than the predetermined first threshold value, that a rotor bar fault is not present.

According to one embodiment of the invention, the method further comprises the step of calculating a temperature difference change between the temperature difference at a first instant and the temperature difference at a second instant.

According to one embodiment of the invention, the method further comprises the step of comparing the temperature difference change with a predetermined second threshold value.

According to one embodiment of the invention, the method further comprises at least one of the steps of determining, on the basis that the temperature difference change is equal to or higher than the predetermined second threshold value, that a rotor bar fault is present, and determining, on the basis that the temperature difference change is lower than the predetermined second threshold value, that a rotor bar fault is not present.

According to one embodiment of the invention, the method further comprises the step of measuring the temperature at more than two different end ring locations, such as at three, at four, at six, at eight, at ten, or at twelve different end ring locations.

According to one embodiment of the invention, the rotor has a plurality of rotor poles, and the method further comprises the step of measuring the temperature at a number of different end ring locations, the number of different end ring locations being equal with or a multiple of the number of rotor poles.

According to one embodiment of the invention, the method is carried out during a normal operation of the electrical machine.

According to a second aspect of the invention, there is provided a rotor for an electrical machine. The rotor comprises a plurality of rotor bars, and an end ring configured to short circuit the rotor bars. The rotor further comprises a first temperature sensor at a first end ring location, and a second temperature sensor at a second end ring location, the second end ring location being different from the first end ring location.

According to one embodiment of the invention, the rotor further comprises temperature sensors at more than two different end ring locations, such as at three, at four, at six, at eight, at ten, or at twelve different end ring locations.

According to a third aspect of the invention, there is provided an electrical machine comprising a rotor according to any of the preceding embodiments.

According to one embodiment of the invention, the electrical machine is a synchronous machine, and the rotor bars are damper bars configured to function as amortisseur winding during an asynchronous starting phase of the synchronous machine.

BRIEF DESCRIPTION OF THE DRAWINGS

The invention will be explained in greater detail with reference to the accompanying drawing, wherein FIG. 1 shows an electrical machine according to one embodiment of the invention.

DETAILED DESCRIPTION

Referring to FIG. 1, a rotor 10 for an electrical machine 20 according to one embodiment of the invention comprises twelve salient rotor poles 30, each rotor pole 30 comprising five rotor bars 40, in this case so called damper bars. At each end of the rotor 10 there is an end ring 50 to which the rotor bars 40 are attached. The rotor bars 40 as well as the end rings 50 are made in conducting material such as copper, and together they form a damper cage. The purpose of the damper cage is to produce a starting torque and to provide damping of radial rotor oscillations during transients. When the damper cage is subjected to a rotating magnetic field within a stator (not shown) of the electrical machine 20, a current is induced in the rotor bars 40, and the end rings 50 that short circuit the rotor bars 40 allow a free flow of the current. However, if one or more of the rotor bars 40 are at least partially broken, the flow of the current is disturbed.

The inventors of the present invention have established with the help of simulations that if one or several rotor bars 40 of a rotor pole 30 becomes at least partially broken, a redistribution of the current and consequently also of the temperature in the adjacent rotor bars 40 within the same rotor pole 30 take place. However, the broken rotor bar 40 does not appear to affect (at least not as much) the current or the temperature in the remaining rotor bars 40 within the remaining rotor poles 30. Consequently, as a result of rotor bar faults temperature differences between the rotor poles 30 change. If it is assumed that all the rotor poles 30 always have the same temperature in a healthy machine, a rotor bar fault would imply that a temperature difference between a healthy rotor pole 30 and the rotor pole 30 with the rotor bar fault increases.

In order to monitor temperatures at different rotor poles 30, the end ring 50 is provided with a temperature sensor 60 at each rotor pole 30. The temperatures at the different rotor poles 30 during normal operation of the electrical machine 20 are compared with each other in order to be able to detect indications of rotor bar faults. For example, a temperature difference between a first temperature at a first rotor pole 30 and a second temperature at a second rotor pole 30 different from the first rotor pole 30 can be calculated, and the calculated temperature difference can be compared with a predetermined first threshold value of e.g. 20° C. If the temperature difference is equal to or higher than the predetermined first threshold value, it can be determined that a rotor bar fault is present. Otherwise it can be determined that a rotor bar fault is not present.

On the other hand, basing the fault detection solely on temperature differences may become misleading as the readings from different temperature sensors 60 may vary also in a healthy machine. Firstly, the temperature sensors 60 may have different offsets that cause them to produce different readings even when in identical temperatures, and secondly, the monitored electrical machines 20 may have constructional asymmetries that cause the different rotor poles 30 to operate at different temperatures even if the electrical machine 20 is perfectly healthy. It may therefore happen that instead of resulting in an increase of a corresponding temperature difference, a rotor bar fault in an "inherently cold" rotor pole 30 results in a decrease of the temperature difference between the "inherently cold" rotor pole 30 and an "inherently warm" rotor pole 30.

For the aforementioned reason it may be preferable to calculate temperature difference changes between temperature differences at a first instant and temperature differences at a second instant, and to base the fault detection on the temperature difference changes rather than on the temperature differences. For example, if a first temperature difference is defined as a difference between the temperatures at the first and second rotor poles 30 at the time of commissioning of the electrical machine 20, and a second temperature difference is defined as a difference between the temperatures at the first and second rotor poles 30 one year after the commissioning of the electrical machine 20, a temperature difference change between the first and second temperature differences can be calculated. The calculated temperature difference change can be compared with a predetermined second threshold value of e.g. 10° C. If the temperature difference change is equal to or higher than the predetermined second threshold value, it can be determined that a rotor bar fault is present. Otherwise it can be determined that a rotor bar fault is not present.

According to the embodiment of FIG. 1 the temperature is measured at each rotor pole 30 i.e. at twelve end ring locations. It is however also possible to measure the temperature at only two different end ring locations, or at any suitable number of different end ring locations.

The invention is not limited to the embodiments shown above, but the person skilled in the art may modify them in a plurality of ways within the scope of the invention as defined by the claims.

The invention claimed is:

1. A method for detecting a rotor bar fault in a rotor of an electrical machine having a plurality of rotor bars and an end ring configured to short circuit the rotor bars, the method comprising the steps of:

measuring a first temperature at a first end ring location, and measuring a second temperature at a second end ring location, the second end ring location being different from the first end ring location;

calculating a temperature difference between the first temperature and the second temperature;

calculating a temperature difference change between the temperature difference at a first time and the temperature difference at a second time; and using the temperature difference, the temperature difference change, or both to determine that a rotor bar fault is present.

2. The method according to claim 1, wherein the method further includes the step of comparing the temperature difference change with a predetermined second threshold value.

3. The method according to claim 2, wherein the method further includes at least one of the following steps:

determining, on the basis that the temperature difference change is equal to or higher than the predetermined second threshold value, that a rotor bar fault is present, and determining, on the basis that the temperature difference change is lower than the predetermined second threshold value, that a rotor bar fault is not present.

4. The method according to claim 1, wherein the method further includes the step of comparing the temperature difference with a predetermined first threshold value.

5. The method according to claim 4, wherein the method further includes at least one of the following steps:

determining, on the basis that the temperature difference is equal to or higher than the predetermined first threshold value, that a rotor bar fault is present, and determining, on the basis that the temperature difference is lower than the predetermined first threshold value, that a rotor bar fault is not present.

6. The method according to claim 1, wherein the method further includes the step of measuring the temperature at more than two different end ring locations, such as at three, at four, at six, at eight, at ten, or at twelve different end ring locations.

7. The method according to claim 1, wherein the rotor has a plurality of rotor poles, and the method further includes the step of measuring another temperature at a number of different end ring locations, the number of different end ring locations being equal with or a multiple of the number of rotor poles.

8. The method according to claim 1, wherein the method is carried out during a normal operation of the electrical machine.

\* \* \* \* \*